US006268635B1

(12) United States Patent
Wood

(10) Patent No.: US 6,268,635 B1
(45) Date of Patent: Jul. 31, 2001

(54) DIELECTRIC LINKS FOR MICROELECTROMECHANICAL SYSTEMS

(75) Inventor: Robert L. Wood, Cary, NC (US)

(73) Assignee: JDS Uniphase Inc. (CA)

( * ) Notice: Subject to any disclaimer, the term of this patent is extended or adjusted under 35 U.S.C. 154(b) by 0 days.

(21) Appl. No.: 09/366,933

(22) Filed: Aug. 4, 1999

(51) Int. Cl.[7] .................................................... H01L 29/84

(52) U.S. Cl. ............................................ 257/415; 257/417

(58) Field of Search .................................... 257/254, 415, 257/417–420; 310/307

(56) References Cited

U.S. PATENT DOCUMENTS

| | | | | |
|---|---|---|---|---|
| 4,680,606 | * | 7/1987 | Knutti et al. | 257/419 |
| 5,058,856 | * | 10/1991 | Gordon | 251/11 |
| 5,216,490 | * | 6/1993 | Greiff et al. | 73/517 |
| 5,290,400 | | 3/1994 | Bobbio | 156/655 |
| 5,619,061 | * | 4/1997 | Goldsmith et al. | 257/528 |
| 5,631,428 | * | 5/1997 | Catanescu et al. | 73/724 |
| 5,909,078 | | 6/1999 | Wood et al. | 310/307 |
| 5,914,801 | | 6/1999 | Dhuler et al. | 359/230 |
| 6,060,756 | * | 5/2000 | Machida et al. | 257/415 |
| 6,118,164 | * | 9/2000 | Seefeldt et al. | 257/417 |

FOREIGN PATENT DOCUMENTS

| | | |
|---|---|---|
| WO 94/18697 | 8/1994 | (WO) . |
| WO 99/16096 | 4/1999 | (WO) . |

OTHER PUBLICATIONS

Koester et al., *MUMPS Design Handbook,* Revision 4.0, Cronos Integrated Microsystems, May 1999.
International Search Report, PCT/US00/20517, Nov. 14, 2000.

* cited by examiner

*Primary Examiner*—Eddie Lee
*Assistant Examiner*—Allan R. Wilson
(74) *Attorney, Agent, or Firm*—Myers Bigel Sibley & Sajovec

(57) ABSTRACT

Microelectromechanical structures include first and second movable conductive members that extend along and are spaced apart from a microelectronic substrate and are spaced apart from one another, and a movable dielectric link or tether that mechanically links the first and second movable conductive members while electrically isolating the first and second movable conductive members from one another. The movable dielectric link preferably comprises silicon nitride. These microelectromechanical structures can be particularly useful for mechanically coupling structures that are electrically conducting, where it is desired that these structures be coupled in a manner that can reduce and preferably prevent electrical contact or crosstalk. These microelectromechanical structures can be fabricated by forming a sacrificial layer on a microelectronic substrate and forming a dielectric link on the sacrificial layer. First and second spaced apart conductive members are electroplated on the sacrificial layer, such that the first and second spaced apart conductive members both are attached to the dielectric link. The sacrificial layer is then at least partly removed, for example by etching, to thereby release the dielectric layer and at least a portion of the first and second conductive members from the microelectronic substrate.

22 Claims, 8 Drawing Sheets

DIELECTRIC LINKS FOR MICROELECTROMECHANICAL SYSTEMS

FIELD OF THE INVENTION

This invention relates to electromechanical systems, and more particularly to microelectromechanical systems and fabrication methods therefor.

BACKGROUND OF THE INVENTION

Microelectromechanical systems (MEMS) have been developed as alternatives to conventional electromechanical devices, such as relays, actuators, valves and sensors. MEMS devices are potentially low-cost devices, due to the use of microelectronic fabrication techniques. New functionality also may be provided, because MEMS devices can be much smaller than conventional electromechanical devices.

A major breakthrough in MEMS devices is described in U.S. Pat. 5,909,078 entitled *Thermal Arched Beam Microelectromechanical Actuators* to the present inventor et al., the disclosure of which is hereby incorporated herein by reference. Disclosed is a family of thermal arched beam microelectromechanical actuators that include an arched beam which extends between spaced apart supports on a microelectronic substrate. The arched beam expands upon application of heat thereto. Means are provided for applying beat to the arched beam to cause farther arching of the beam as a result of thermal expansion thereof, to thereby cause displacement of the arched beam.

Unexpectedly, when used as a microelectromechanical actuator, thermal expansion of the arched beam can create relatively large displacement and relatively large forces while consuming reasonable power. A coupler can be used to mechanically couple multiple arched beams. At least one compensating arched beam also can be included which is arched in a second direction opposite to the multiple arched beams and also is mechanically coupled to the coupler. The compensating arched beams can compensate for ambient temperature or other effects to allow for self-compensating actuators and sensors. Thermal arched beams can be used to provide actuators, relays, sensors, microvalves and other MEMS devices. Other thermal arched beam microelectromechanical devices and associated fabrication methods are described in U.S. Pat. No. 5,994,816 to Dhuler et al. entitled *Thermal Arched Beam Microelectromechanical Devices and Associated Fabrication Methods*, the disclosure of which is hereby incorporated herein by reference.

As MEMS devices become more sophisticated, there continues to be a need for MEMS structures that can be used in more sophisticated MEMS devices. Fabrication of these structures preferably should be accomplished using conventional MEMS fabrication process steps.

SUMMARY OF THE INVENTION

The present invention provides microelectromechanical structures that include first and second movable metallic members that extend along and are spaced apart from a microelectronic substrate and are spaced apart from one another, and a movable dielectric link or tether that mechanically links the first and second movable metallic members while electrically isolating the first and second movable metallic members from one another. The movable dielectric link preferably comprises silicon nitride. These microelectromechanical structures can be particularly useful for mechanically coupling structures that are electrically conducting, where it is desired that these structures be coupled in a manner that can reduce and preferably prevent electrical contact or crosstalk.

The movable dielectric link is attached to the first and second movable metallic members beneath the first and second movable metallic members. Alternately, the movable dielectric link can be attached to the first and second movable metallic members above the first and second movable metallic members, opposite the microelectronic substrate. When the movable dielectric link is attached to the first and second movable members beneath the first and second movable metallic members, a trench can be provided in the microelectronic substrate adjacent the movable dielectric link, to reduce and preferably prevent stiction between the movable dielectric link and the microelectronic substrate thereunder.

More than two movable metallic members can be mechanically linked to a single movable dielectric link. Moreover, a movable third conductive member can extend between the first and second movable metallic members and across the movable dielectric link. The third conductive member can be spaced apart from the first and second movable metallic members and the movable dielectric link, so that independent movement can be provided.

The movable dielectric link can be attached to the first and second movable metallic members due to the adhesion therebetween. Moreover, first and second anchors can be added to anchor the movable dielectric link to the first movable metallic member and to the second movable metallic member, respectively. The anchors can comprise an aperture in the movable metallic member, and a first mating protrusion that extends from the movable metallic member into the aperture. Alternatively, the aperture can be provided in the movable metallic member and the protrusion can be provided in the movable dielectric link. The anchor also can comprise a notch in the movable metallic member or the movable dielectric link. Other configurations of anchors can be used.

The dielectric link can link the first and second movable metallic members at respective first and second ends of the movable metallic member that are adjacent one another. Alternatively, one or more of the movable metallic members can be attached to the dielectric link at intermediate portions thereof. The movable metallic members preferably comprise electroplated members and more preferably electroplated nickel members. A plating base layer can be provided between the movable metallic members and the movable dielectric link.

Movable dielectric links according to the invention can be used with many microelectromechanical devices including microelectromechanical actuators and sensors that move at least one of the first and second movable metallic members. Movable dielectric links according to the present invention can be particularly advantageous when used with thermal arched beam microelectromechanical systems as described in the above-cited patents.

Microelectromechanical structures according to the present invention can be fabricated by forming a sacrificial layer on a microelectronic substrate and forming a dielectric link on the sacrificial layer. First and second spaced apart metallic members are electroplated on the sacrificial layer, such that the first and second spaced apart metallic members both are attached to the dielectric link. The sacrificial layer then is at least partly removed, for example by etching, to thereby release the dielectric layer and at least a portion of the first and second metallic members from the microelectronic substrate.

The dielectric link can be formed prior to electroplating the first and second spaced apart metallic members, such that the dielectric link is attached to the first and second metallic members beneath the first and second metallic members. In other embodiments, the electroplating step can precede the step of forming a dielectric link, such that the dielectric link is attached to the first and second metallic members above the first and second metallic members, opposite the microelectronic substrate.

When the electroplating is performed prior to forming the dielectric link, the dielectric link can be formed between the first and second spaced apart metallic members and extending onto the first and second spaced apart metallic members opposite the sacrificial layer. Prior to electroplating, a plating base preferably can be formed on the sacrificial layer. The first and second spaced apart metallic members are then plated on the plating base.

Alternatively, when the dielectric link is formed prior to electroplating, the first and second spaced apart metallic members can be electroplated on the sacrificial layer and extending onto the dielectric link, such that the first and second spaced apart metallic members both are attached to the dielectric link. A plating base preferably can be formed on the sacrificial layer and extending onto the dielectric link, prior to electroplating the first and second spaced apart metallic members on the plating base.

In preferred methods of the present invention wherein the dielectric link is formed prior to electroplating, the sacrificial layer can be a first sacrificial layer. A second sacrificial layer can be formed on the first sacrificial layer and spaced apart from the dielectric link. The first and second spaced apart metallic members then are electroplated on the second sacrificial layer, such that the first and second spaced apart metallic members both are attached to the dielectric link. The removing step then can be accomplished by etching the first and second sacrificial layers, to thereby separate the dielectric link and at least a portion of the first and second metallic members from the microelectronic substrate.

The etching step can be followed by the step of forming a trench in the microelectronic substrate beneath the dielectric link, to further separate the dielectric link from the microelectronic substrate. In particular, the dielectric layer can be formed by blanket forming a dielectric layer on the microelectronic substrate and on the sacrificial layer, and patterning the dielectric layer to form the dielectric link and a dielectric mask on the microelectronic substrate that is spaced apart from the dielectric link. The trench then can be formed by etching the microelectronic substrate beneath the dielectric link using the dielectric mask as an etch mask.

The dielectric link preferably can comprise silicon nitride, the metallic members preferably can comprise nickel and the sacrificial layers preferably can comprise silicon dioxide. However, in other embodiments, the movable metallic members can be replaced with movable conductive, nonmetallic members such as doped polysilicon, that can be formed using deposition and lithography and/or other processes for forming MEMS conductive layers. Accordingly, microelectromechanical structures and fabrication methods can be provided that can mechanically link members that are electrically conducting but can provide high dielectric isolation between the linked members.

DETAILED DESCRIPTION OF PREFERRED EMBODIMENTS

Figure 1A:
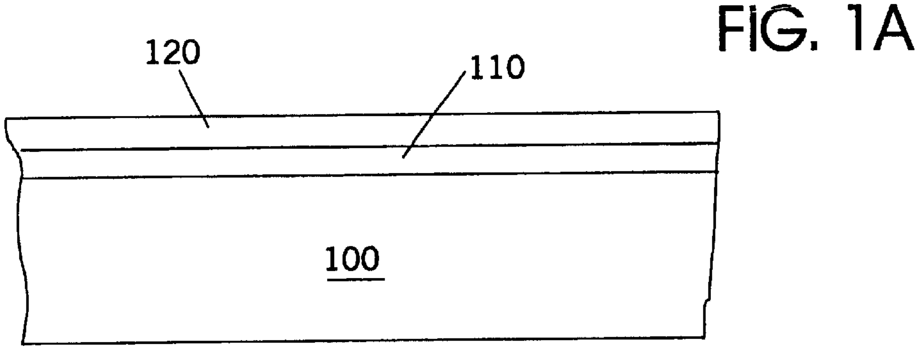
FIGS. 1A–1D are cross-sectional views of first microelectromechanical structures including dielectric links according to the present invention, during intermediate fabrication steps.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Also, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIGS. 1A–1D are cross-sectional views of first embodiments of microelectromechanical structures including dielectric links according to the present invention, during intermediate fabrication steps. Referring now to FIG. 1A, a sacrificial layer 110 such as a layer of silicon dioxide is formed on a microelectronic substrate 100 such as a monocrystalline silicon substrate. The silicon dioxide can be chemical vapor deposited silicon dioxide, spin-on-glass, thermally grown silicon dioxide or other conventional forms of silicon dioxide. Other layers such as low pressure chemical vapor deposited phosphosilicate glass (PSG) also may be used. A layer of silicon nitride and/or another dielectric 120 is formed on the sacrificial layer 110. The layer 120 preferably is formed by low pressure chemical vapor deposition of silicon nitride or other conventional techniques, and preferably is a layer of low stress silicon nitride. Other dielectrics also may be used in layer 120, such as organic insulators including polyimide, as long as the sacrificial layer 110 can be etched at different etch rates than the layer 120.

Figure 1B:
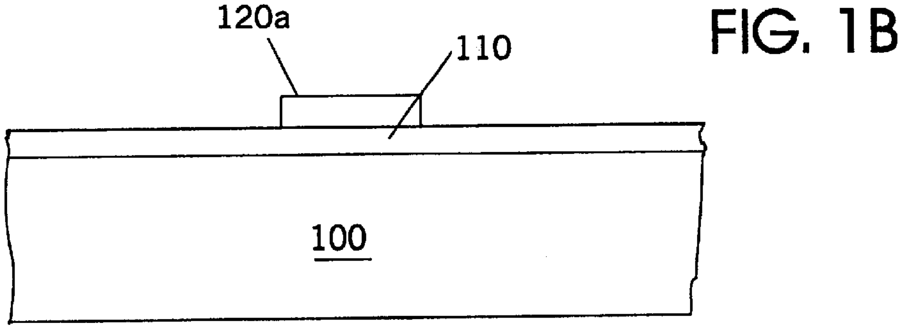

Referring now to FIG. 1B, the layer 120 is patterned to form a dielectric link or tether 120*a* on the sacrificial layer

110. Conventional photolithography can be used. The dielectric link 120*a* preferably comprises silicon nitride. However, other dielectric materials may be used.

Figure 1C:
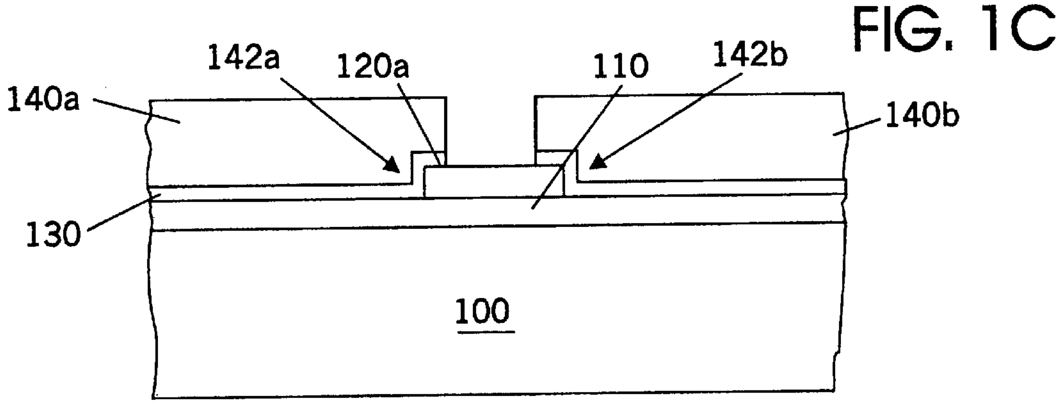

Referring now to FIG. 1C, an optional plating base layer 130 then is formed on the sacrificial layer 110 and on the dielectric link 120*a* and patterned using conventional techniques. First and second spaced apart metallic members 140*a* and 140*b* then are electroplated on the plating base layer 130 using a conventional electroplating stencil or mold if necessary. The plating base layer 130 can be patterned on the dielectric link before or after the electroplating process is performed. In preferred embodiments of the present invention, the first and second spaced apart metallic members 140*a* and 140*b* comprise nickel and the plating base comprises copper. However, other materials also can be used. It also will be understood by those having skill in the art that other conductive layers, such as doped polysilicon can be formed and patterned on the sacrificial layer and on the dielectric link 120*a* using conventional patterning techniques, instead of or in addition to the first and second spaced apart metallic members 140*a* and 140*b*.

Still referring to FIG. 1C, it can be seen that the plating base 130 and/or the electroplated members 140*a* and 140*b* include a respective notch 142*a* and 142*b* therein that conforms to the dielectric link. This notch can provide an anchor to promote improved adhesion of the spaced apart metallic members 140*a* and 140*b* to the dielectric link 120*a*.

Figure 1D:
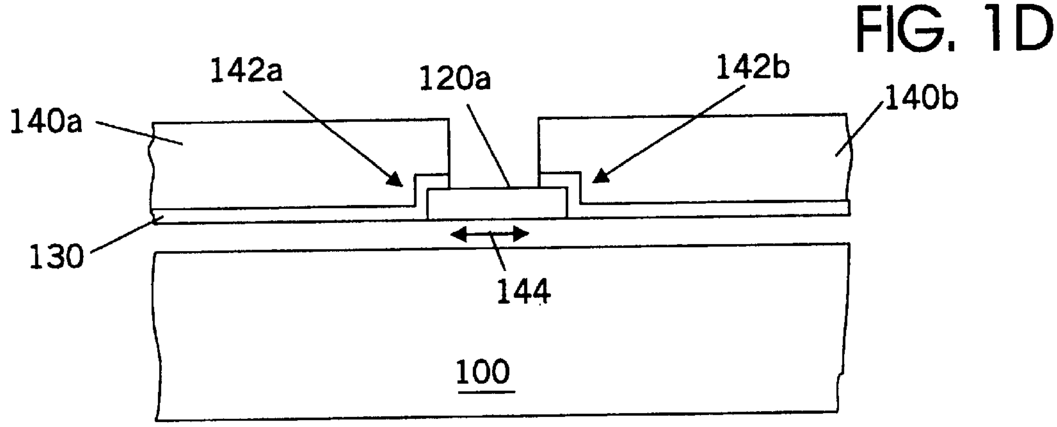

Finally, referring to FIG. 1D, at least part of the sacrificial layer 110 is removed, to thereby release or separate the dielectric link and at least a portion of the first and second metallic members 140*a* and 140*b* from the microelectronic substrate 100. The removal can take place by an etch that etches the sacrificial layer 110 without substantially etching the dielectric link 120*a* or the spaced apart metallic members 140*a*, 140*b*. Hydrofluoric acid or other conventional etchants may be used. Other conventional MEMS fabrication steps also may be performed including metallization, dicing and packaging. See for example the *MUMPS Design Handbook Revision* 4.0 by Koester et al., Cronos Integrated Microsystems, May 1999, the disclosure of which is hereby incorporated herein by reference.

Still referring to FIG. 1D, first microelectromechanical structures according to the present invention include a microelectronic substrate 100, first and second movable metallic members 140*a*, 140*b* that extend along and are spaced apart from the microelectronic substrate 100, and are spaced apart from one another. A movable dielectric link 120*a* mechanically links the first and second movable metallic members, while electrically isolating the first and second movable metallic members from one another. The movable metallic members 140*a* and 140*b* can move along the substrate face in the direction shown by arrows 144.

In the fabrication methods and structures shown in FIGS. 1A–1D, the movable dielectric link 120*a* is beneath the first and second spaced apart metallic members 140*a*, 140*b*. In contrast, in FIGS. 2A–2D, the dielectric link extends above the spaced apart metallic members 140*a*, 140*b*, opposite the substrate 100.

Figure 2A:
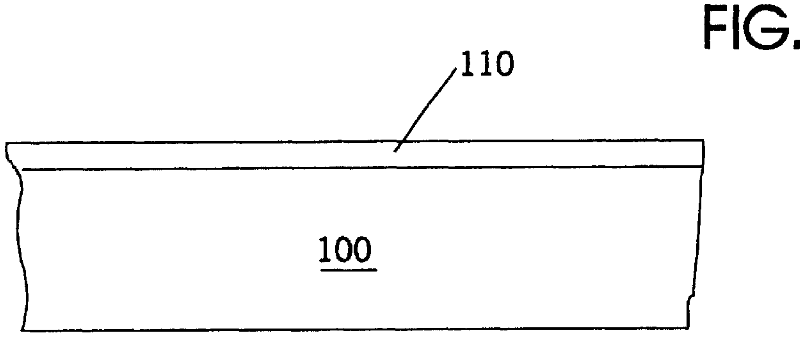
FIGS. 2A–2D are cross-sectional views of second microelectromechanical structures including dielectric links according to the present invention, during intermediate fabrication steps.
Figure 2B:
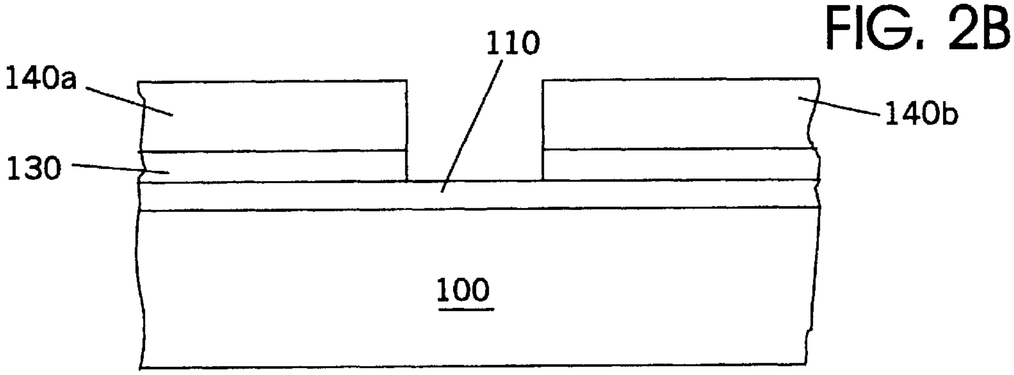

In particular, referring to FIG. 2A, the sacrificial layer 110 is formed on the microelectronic substrate 100. Then, in FIG. 2B, the plating base 130 and the spaced apart metallic members 140*a* and 140*b* are formed using conventional electroplating techniques. As with FIG. 1C, the plating base 130 can be omitted and other conductive materials may be used.

Figure 2C:
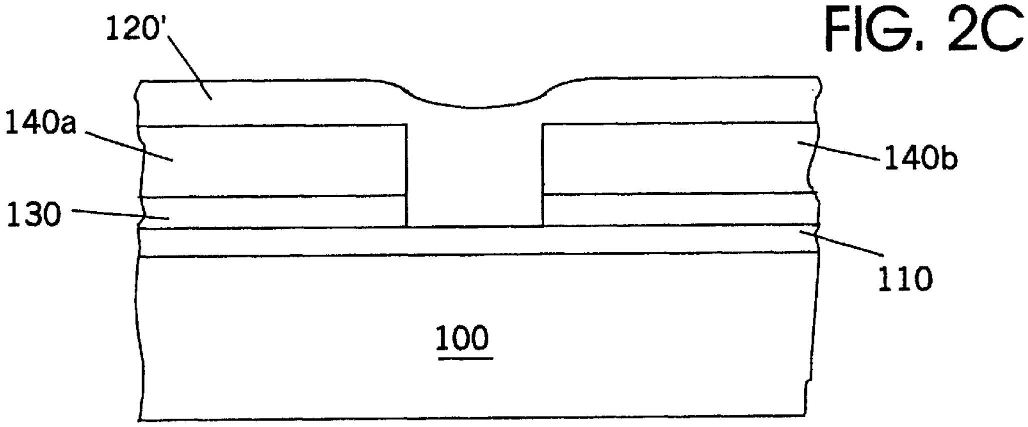

Then, referring to FIG. 2C, a silicon nitride and/or other dielectric layer 120' is formed on the first and second metallic members 140*a*, 140*b* opposite the microelectronic substrate 100. The layer 120' also preferably extends into the space between the spaced apart metallic members 140*a*, 140*b*. Although the layer 120' is shown filling the space between the spaced apart metallic members 140*a*, 140*b*,it need not fill the entire space.

Figure 2D:
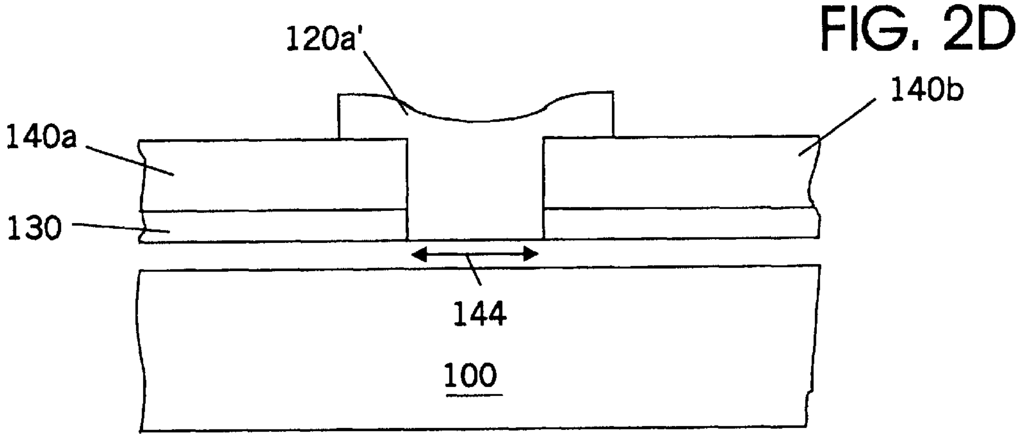

Then, as shown in FIG. 2D, the layer 120' is patterned using conventional techniques to form a dielectric link 120*a*' that extends on the spaced apart movable members 140*a*, 140*b* opposite the substrate 100. The sacrificial layer 110 is then at least partially removed as was described in connection with FIG. 1D. Accordingly, in the microelectromechanical structures of FIG. 2D, the movable dielectric link 120*a* is attached to the first and second movable metallic members 140*a*, 140*b* above the first and second movable metallic members, rather than beneath the members as was the case in FIG. 1D.

Figure 3A:
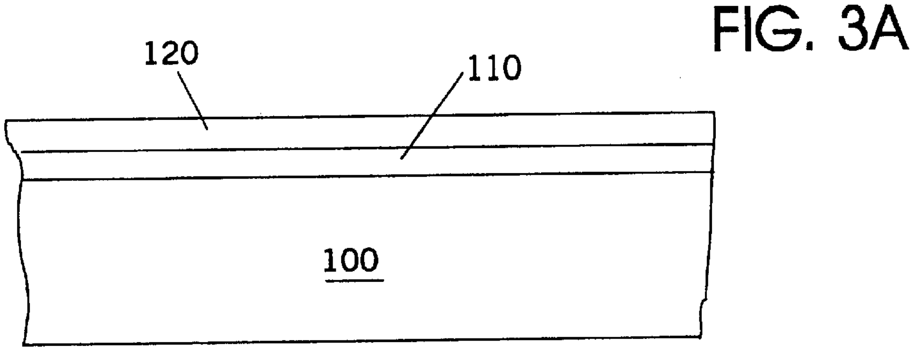
FIGS. 3A–3D are cross-sectional views of third microelectromechanical structures including dielectric links according to the present invention, during intermediate fabrication steps.
Figure 3B:
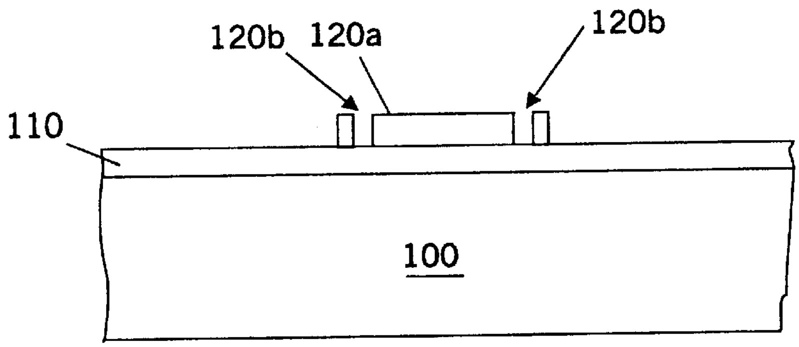

FIGS. 3A–3D illustrate other microelectromechanical structures and fabrication methods of the present invention. FIG. 3A corresponds to FIG. 1A. FIG. 3B corresponds to FIG. 1B, except that vias or apertures 120*b* are patterned in the dielectric link 120*a*. The vias may be patterned simultaneous with the patterning of layer 120 or in a separate step.

Figure 3C:
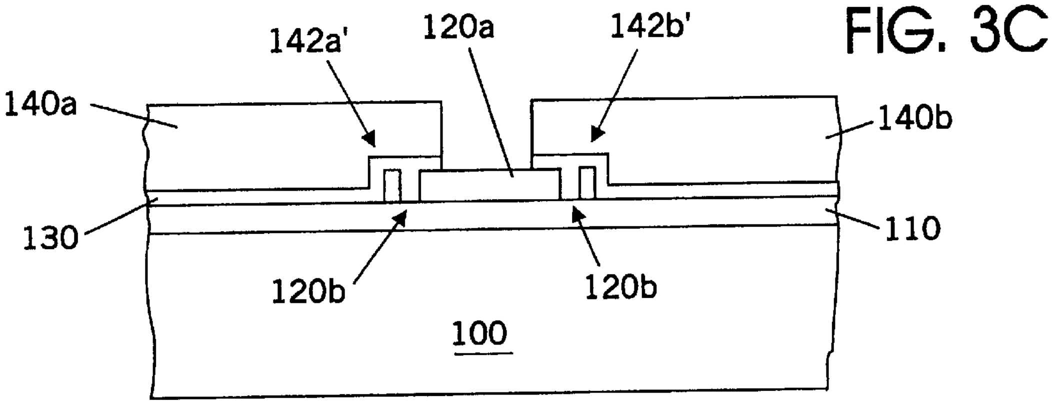
Figure 3D:
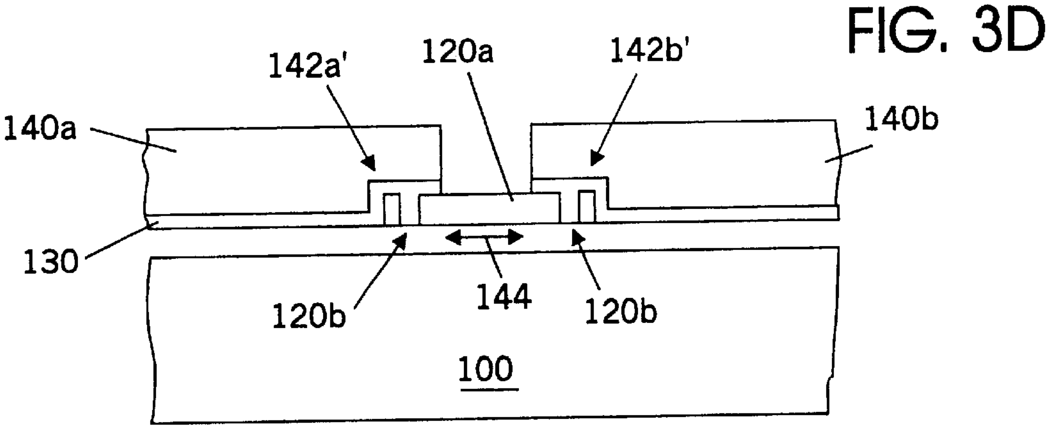

Then, as shown in FIG. 3C, the plating base 130 and/or the plated metallic layers 140*a*, 140*b* also are formed in the vias 120*b*,to thereby form anchors 142 142*b*'. Stated differently, vias are formed in the dielectric link and mating protrusions are formed in the plating base and/or plated layers, to provide anchors, and thereby promote additional adhesion between the dielectric link and the spaced apart metallic members 140*a* and 140*b*. The remainder of the processing in FIGS. 3C and 3D corresponds to that of FIGS. 1C and 1D, and need not be described again. It also will be understood that alternatively, vias can be formed in the spaced apart metallic members and protrusions may be formed in the dielectric link. Other forms of anchors including ridges, roughened surfaces and/or adhesion promoting layers, can be used.

Figure 4A:
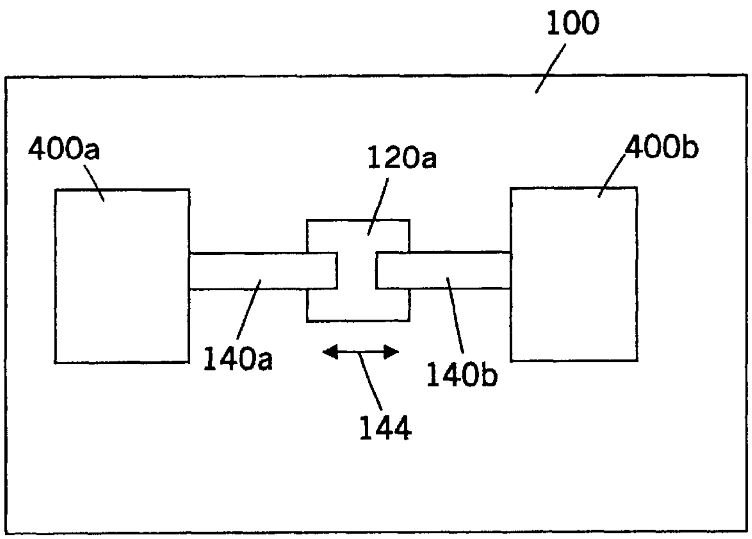
FIGS. 4A–4C are top views of microelectromechanical structures according to the present invention.
Figure 4B:
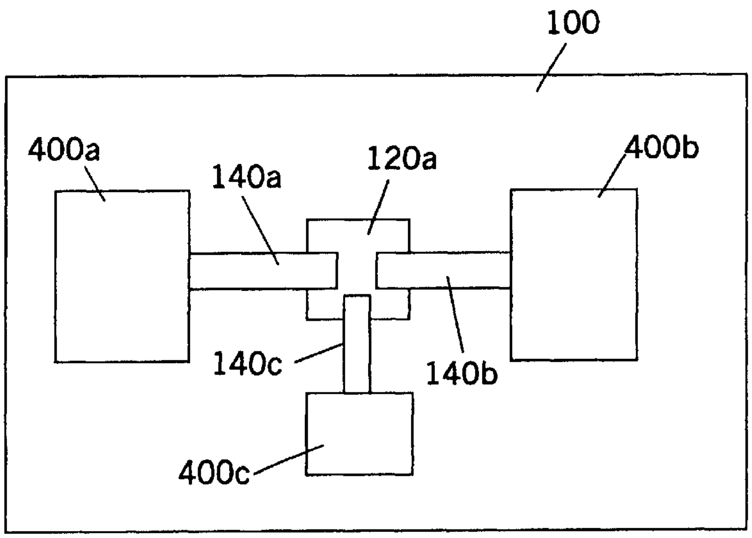
Figure 4C:
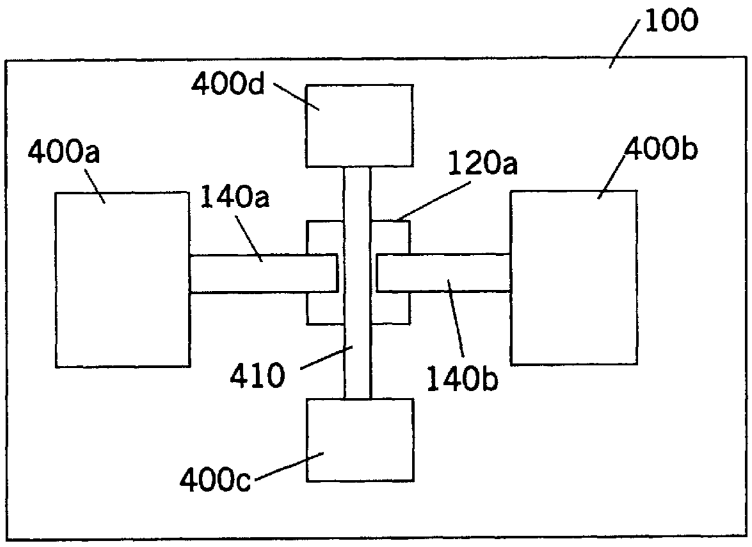

FIGS. 4A–4C illustrate top views of various microelectromechanical structures according to the present invention. As shown in FIG. 4A, one or more microelectromechanical actuators and/or sensors and/or other microelectromechanical devices 400*a*, 400*b* move at least one of the first and second movable metallic members 140*a*, 140*b*. The dielectric link 120*a* mechanically links the first and second movable metallic members 140*a*, 140*b* while electrically isolating the first and second movable metallic members from one another. Although the dielectric link 120*a* is shown with a square shape, other shapes can be used.

As shown in FIG. 4B, more than two microelectromechanical devices can be included on a substrate 100 and linked to a single dielectric link 120*a*. For example, in FIG. 4B, three devices 400*a*–400*c* are coupled to three movable members 140*a*–140*c*.

In FIG. 4C, four microelectromechanical devices 400*a*–400*d* are used. The first and second movable metallic members 140*a* and 140*b* are mechanically coupled by a dielectric link 120*a*. A third movable member 410 extends across the dielectric link but is spaced apart therefrom, so that independent movement may be obtained for member 410. It will be understood that member 410 can be fabricated by forming a sacrificial layer on the dielectric link and then forming the member 410 on the sacrificial layer opposite the dielectric link. When the sacrificial layer is removed, member 410 can move independent of members 140*a* and 140*b*.

It will be understood that in all of the embodiments of FIGS. 4A–4C, additional microelectronic circuitry can be formed in the substrate 100, and multiple sets of links and members can be formed on a single substrate. It also will be understood that in the embodiments described above, the dielectric link 120*a* is attached to the ends of the movable metallic members 140*a*–140*c*. However, the dielectric link 120*a* can be attached to intermediate portions of one or more of the movable metallic members 140*a*–140*c*, to thereby form a wide variety of microelectromechanical devices.

FIGS. 5A–5I illustrate other microelectromechanical structures according to the present invention during intermediate fabrication steps. In general, the structures and fabrication methods of FIGS. 5A–5I add a trench in the microelectronic substrate beneath the movable dielectric link. It has been found that stiction can occur between the dielectric link and the microelectronic substrate due to surface adhesive forces. The trench can further space apart the dielectric link from the microelectronic substrate, to thereby reduce and preferably eliminate stiction.

Figure 5A:
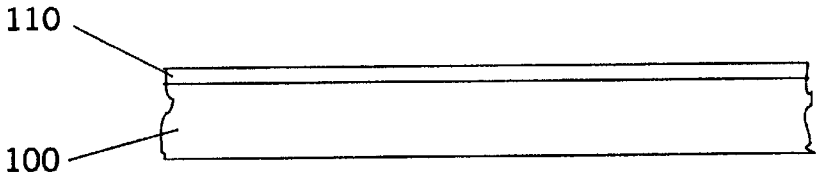
FIGS. 5A–5I are cross-sectional views of fourth microelectromechanical structures including dielectric links according to the present invention, during intermediate fabrication steps.
Figure 5B:
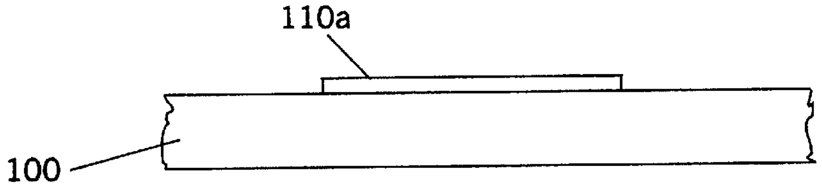
Figure 5C:
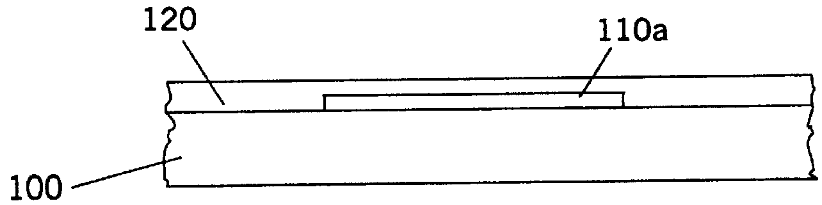
Figure 5D:
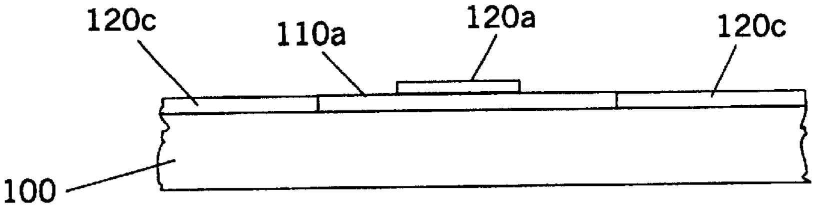

More specifically, referring to FIG. 5A, a first sacrificial layer 110 is formed on a substrate 100. The first sacrificial layer 110 is then patterned in FIG. 5B to form a patterned first sacrificial layer 110*a*. Then, in FIG. 5C, silicon nitride and/or another dielectric layer 120 is formed on the substrate including on the patterned first sacrificial layer 110*a*. The layer 120 is then patterned in FIG. 5D to form a dielectric link 120*a* and a mask 120*c* that will be used to form the trench as described below.

Figure 5E:
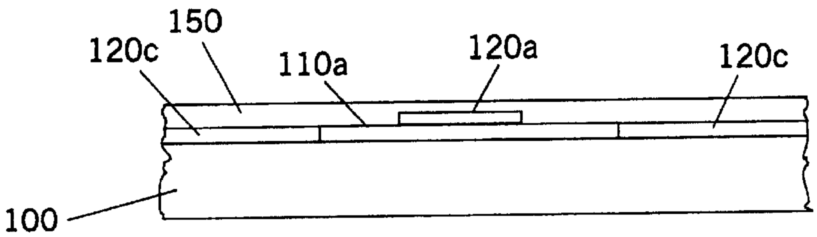

Referring now to FIG. 5E, a second sacrificial layer then is formed on the first patterned sacrificial layer 110*a*, on the dielectric link 120*a* and on the mask 120*c*. The second sacrificial layer 150 preferably comprises the same material as the first sacrificial layer 110, such as silicon dioxide.

Figure 5F:
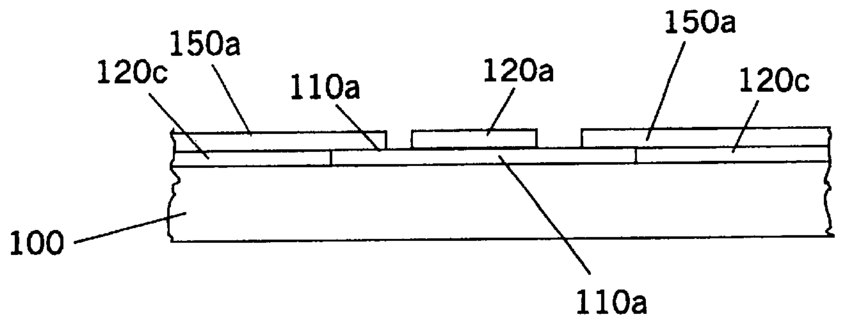
Figure 5G:
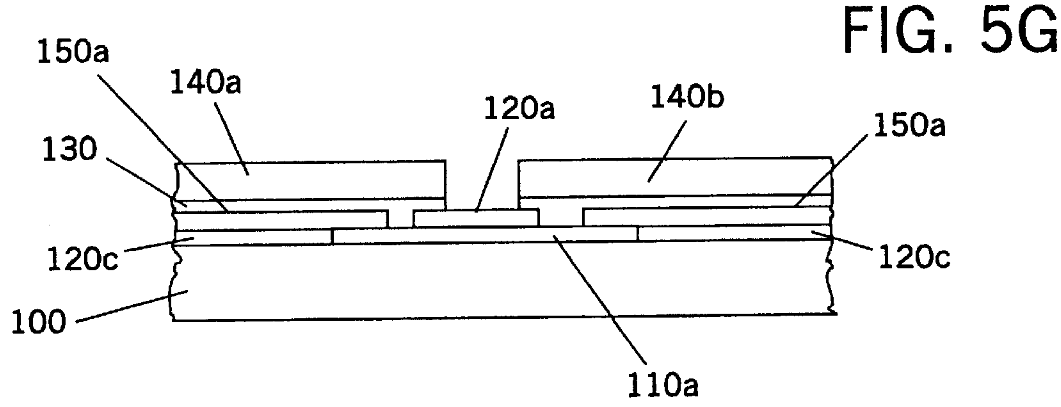
Figure 5H:
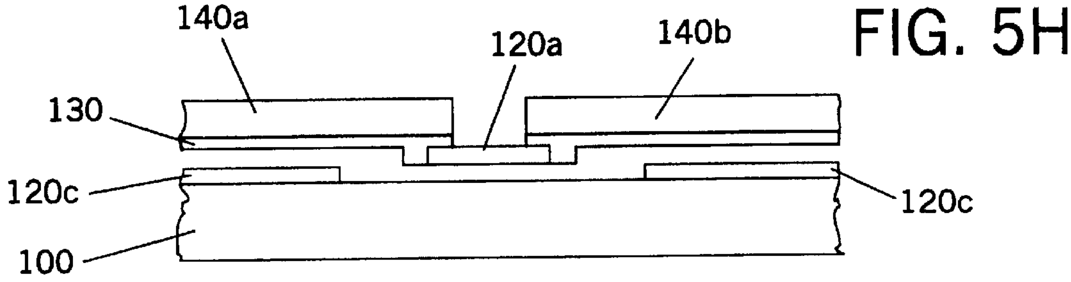

Referring now to FIG. 5F, the second sacrificial layer 150 is patterned to form a patterned second sacrificial layer 150*a*. A plating base 130 then is formed, and the first and second members 140*a* and 140*b* are plated on the second sacrificial layer and on the dielectric link 120*a*. Then, in FIG. 5H, the first and second sacrificial layers are at least partially removed, to thereby release the dielectric link and at least a portion of the first and second metallic members 140*a* and 140*b* from the microelectronic substrate 100.

Figure 5I:
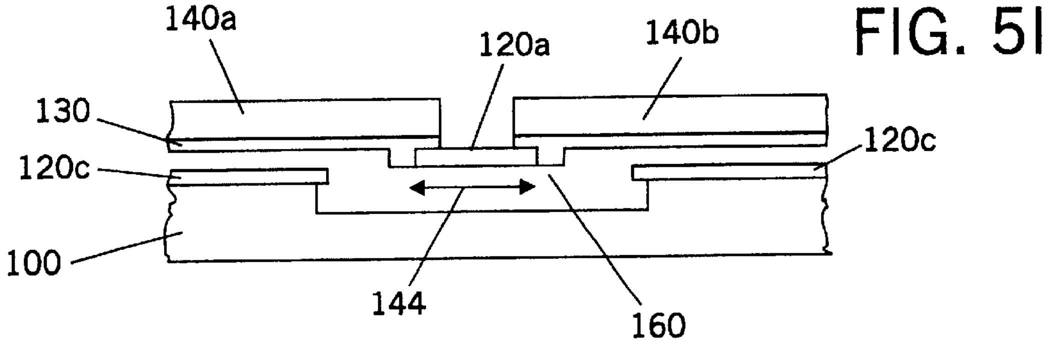

Finally, referring to FIG. 5I, the microelectronic substrate 100 is etched using the mask 120*c* as an etch mask, to form a trench 160 beneath the dielectric layer. The substrate may be etched to a depth of between about 10 $\mu$m and about 30 $\mu$m. Etching can take place by continuing the same etch that was used to etch the sacrificial layers or by using another etchant.

Microelectromechanical structures according to FIG. 51 include a trench 160 in the microelectronic substrate adjacent the movable dielectric link 120*a* that is attached to the first and second movable metallic members 140*a*, 140*b* beneath the first and second movable metallic members. It also will be understood that the methods of FIGS. 2A–2D and 3A–3D may be modified to form a trench 160 in the microelectronic substrate 100.

Figure 6A:
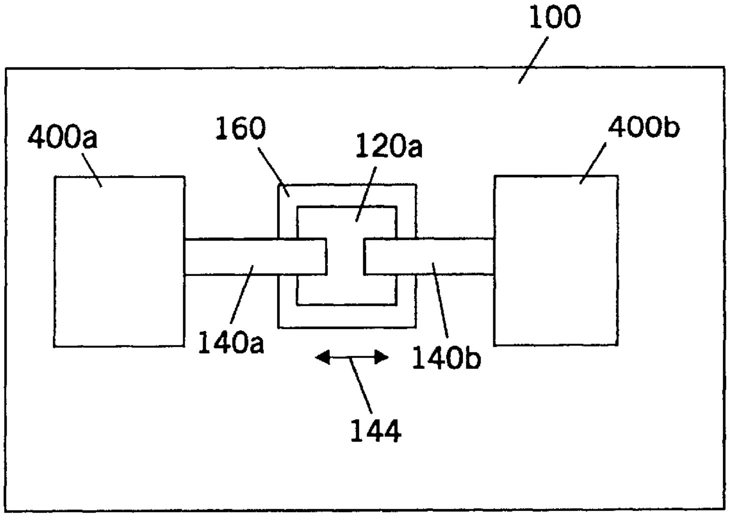
FIGS. 6A–6C are top views of additional microelectromechanical structures according to the present invention.
Figure 6B:
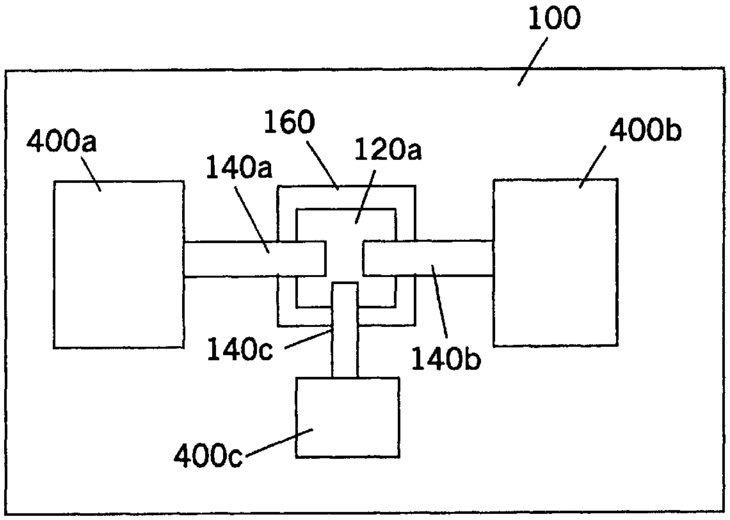
Figure 6C:
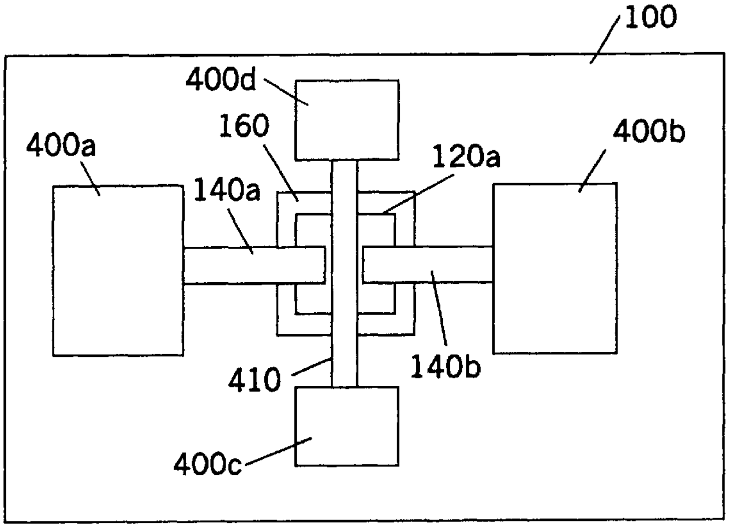

FIGS. 6A–6A are top views of other microelectromechanical structures according to the present invention. FIGS. 6A–6C correspond to FIGS. 4A–4C, except that the trench 160 also is shown.

Figure 7:
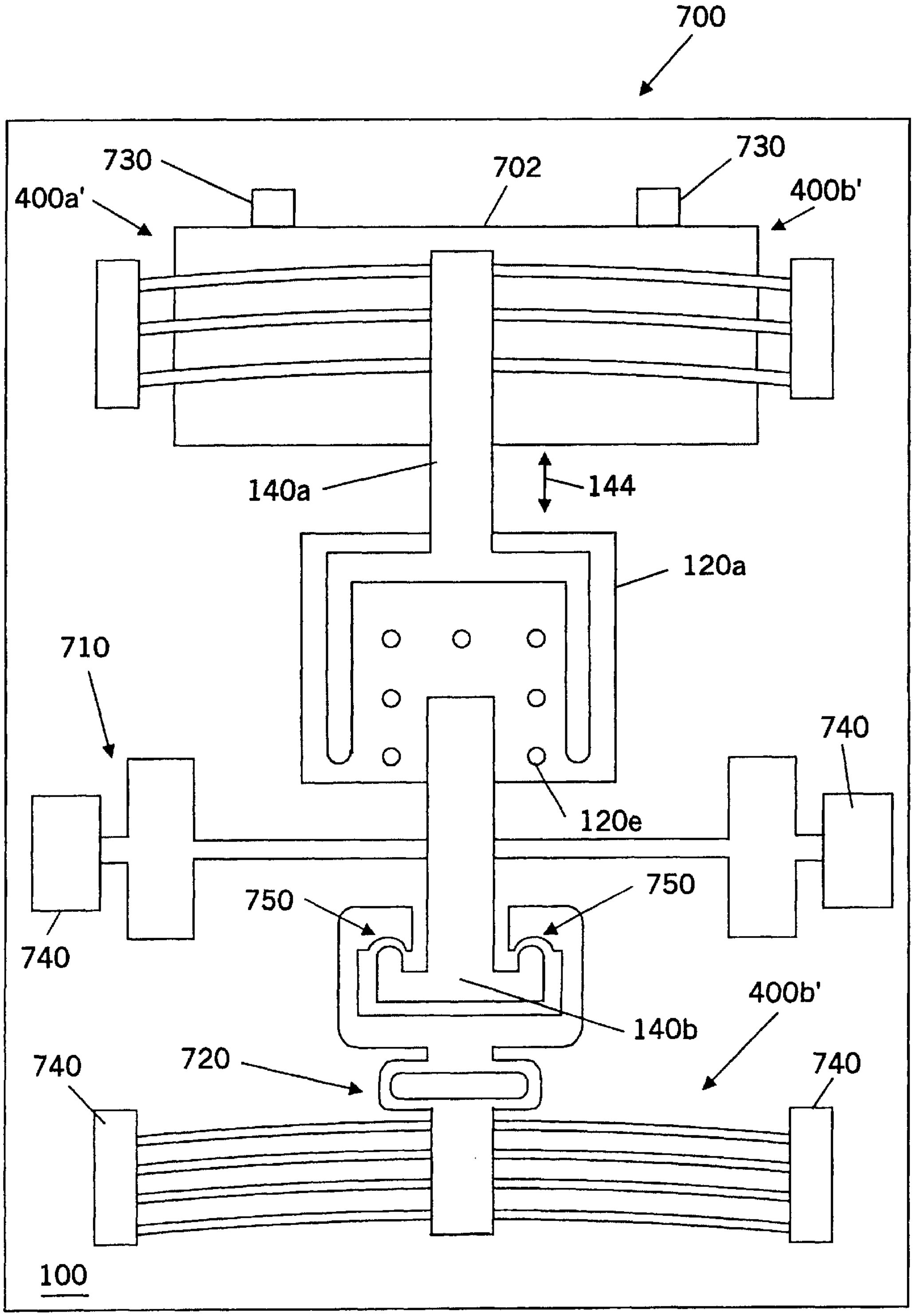
FIG. 7 is a top view of a micro-relay that includes a dielectric link according to the present invention.

FIG. 7 is a top view of a micro-relay that includes thermal arched beam actuators that were described in the above-incorporated U.S. Pat. Nos. 5,909,078 and 5,994,816, and includes a dielectric link 120*a* according to the present invention. As shown in FIG. 7, the micro-relay 700 includes first and second microelectromechanical actuators 400*a*' and 400*b*' in the form of thermal arched beam microelectromechanical actuators. Actuator 400*a*' can be an active actuator that is heated by a heater 702 via control contacts 730 to cause movement of the first movable member 140*a* in the direction shown by arrows 144. Actuator 400*b*' can be a passive actuator that can provide thermal compensation and/or a load to the micro-relay. The dielectric link 120*a* mechanically links movable metallic members 140*a* and 140*b* while maintaining electrical isolation therebetween.

As shown in FIG. 7, the dielectric link 120*a* can include holes 120*e* therein which can be used to promote passage of the etchant that is used to release the sacrificial layers in FIGS. 1D, 2D, 3D and 5H. The second movable metallic member 140*b* can be stabilized by one or more suspension beams 710. A hysteresis loop 720 can be used to ensure that the micro-relay is not damaged if an overvoltage is applied, by allowing the hysteresis loop to absorb excess force. Load contacts 740 and switch contacts 750 also are shown.

Accordingly, structures and methods of the present invention can allow microelectromechanical devices such as micro-relays, sensors, switch matrices and/or variable capacitors to include a movable mechanical link that permits mechanical coupling of adjacent moving structures, while maintaining dielectric isolation between the structures. They may be particularly useful for mechanically coupling structures that are electrically conducting, where it is desired to couple these structures in a manner that reduces and preferably prevents electrical contact or crosstalk. Thus, for example, high dielectric isolation can be obtained between the control or drive side of a relay and the load side of a relay. Without such a link, it may be difficult to achieve useful isolation in a relay. The dielectric link and fabrication process preferably are used to connect structures that move in the plane of the substrate, such as are formed by surface micromachining of silicon wafers or other MEMS fabrication processes. improved microelectromechanical structures and fabrication methods thereby may be provided.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A microelectromechanical structure comprising:

a microelectronic substrate including a face;

first and second movable metallic members that extend along and are spaced apart from the face of the microelectronic substrate and are spaced apart from one another and are configured for movement in a direction along the face; and a movable dielectric link that mechanically links the first and second movable metallic members and is configured for movement in the direction along the face while electrically isolating the first and second movable metallic members from one another during the movement of the first and second movable metallic members and the link in the direction along the face.

2. A microelectromechanical structure according to claim 1 wherein the movable dielectric link comprises silicon nitride.

3. A microelectromechanical structure according to claim 1 wherein the movable dielectric link is attached to the first and second movable metallic members beneath the first and second movable metallic members.

4. A microelectromechanical structure according to claim 1 wherein the movable dielectric link is attached to the first and second movable metallic members above the first and second movable metallic members.

5. A microelectromechanical structure according to claim 3 further comprising a trench in the microelectronic substrate adjacent the movable dielectric link that is attached to the first and second movable metallic members beneath the first and second movable metallic members.

6. A microelectromechanical structure according to claim 1 wherein the direction is a first direction, the microelectromechanical structure further comprising a third metallic member that extends between the first and second movable metallic members and across the movable dielectric link, the third metallic member being spaced apart from the first and second movable metallic members and the movable dielectric link for movement in a second direction that is different from the first direction independent of the movement in the first direction.

7. A microelectromechanical structure according to claim 1 further comprising a third movable metallic member that is mechanically linked-to the movable dielectric link and is electrically isolated from the first and second movable metallic members.

8. A microelectromechanical structure comprising:

a microelectronic substrate;

first and second movable metallic members that extend along and are spaced apart from the microelectronic substrate and are spaced apart from one another;

a movable dielectric link that mechanically links the first and second movable metallic members while electrically isolating the first and second movable metallic members from one another;

a first anchor that anchors the movable dielectric link to the first movable metallic member; and a second anchor that anchors the movable dielectric link to the second movable metallic member.

9. A microelectromechanical structure according to claim 8 wherein the first anchor comprises a first via in the movable dielectric link and a first mating protrusion that extends from the first movable metallic member into the first via and wherein the second anchor comprises a second via in the movable dielectric link and a second mating protrusion that extends from the second movable metallic member into the second via.

10. A microelectromechanical structure according to claim 8 wherein the first anchor comprises a first notch in the first movable metallic member and wherein the second anchor comprises a second notch in the second movable metallic member.

11. A microelectromechanical structure according to claim 1 wherein the first and second movable metallic members include respective first and second ends that are adjacent one another and wherein the movable dielectric link mechanically links the first and second ends while electrically isolating the first and second movable mechanical members from one another.

12. A microelectromechanical structure according to claim 1 further comprising at least one microelectromechanical actuator on the microelectronic substrate that moves at least one of the first and second movable metallic members along the face of the substrate in the direction.

13. A microelectromechanical structure according to claim 1 further comprising at least one microelectromechanical sensor on the microelectronic substrate that moves at least one of the first and second movable metallic members.

14. A microelectromechanical structure according to claim 1 wherein the first and second movable metallic members are first and second movable electroplated nickel members.

15. A microelectromechanical structure comprising:

a microelectronic substrate;

first and second movable metallic members that extend along and are spaced apart from the microelectronic substrate and are spaced apart from one another;

a movable dielectric link that mechanically links the first and second movable metallic members while electrically isolating the first and second movable metallic members from one another; and a plating base layer between the first and second movable metallic members and the movable dielectric link.

16. A Microelectromechanical structure comprising:

a microelectronic substrate including a face;

first and second movable conductive members that extend along and are spaced apart from the face of the microelectronic substrate and are spaced apart from one another and are configured for movement in a direction along the face; and a movable dielectric link that mechanically links the first and second movable conductive members and is configured for movement in the direction along the face while electrically isolating the first and second movable conductive members from one another during the movement of the first and second movable conductive members and the link in the direction along the face.

17. A microelectromechanical structure according to claim 16 wherein the movable dielectric link comprises silicon nitride and wherein the first and second movable conductive members comprise polysilicon.

18. A microelectromechanical structure according to claim 16 further comprising a trench in the microelectronic substrate adjacent the movable dielectric link that is attached to the first and second movable conductive members beneath the first and second movable conductive members.

19. A microelectromechanical structure according to claim 16 wherein the direction is a first direction, the microelectromechanical structure further comprising a third conductive member that extends between the first and second movable conductive members and across the movable dielectric link, the third conductive member being spaced apart from the first and second movable conductive members and the movable dielectric link for movement in a second direction that is different from the first direction independent of the movement in the first direction.

20. A microelectromechanical structure according to claim 16 further comprising a third movable conductive member that is mechanically linked to the movable dielectric link and is electrically isolated from the first and second movable conductive members.

21. A microelectromechanical structure according to claim 16 further comprising at least one microelectromechanical actuator on the microelectronic substrate that moves at least one of the first and second movable conductive members along the face of the substrate in the direction.

22. A microelectromechanical structure according to claim 16 further comprising at least one microelectromechanical sensor on the microelectronic substrate that moves at least one of the first and second movable conductive members.

* * * * *